United States Patent [19]

Suzuki

[11] 4,437,758

[45] Mar. 20, 1984

[54] ALIGNMENT APPARATUS

[75] Inventor: Akiyoshi Suzuki, Tokyo, Japan

[73] Assignee: Canon Kabushiki Kaisha, Tokyo, Japan

[21] Appl. No.: 351,456

[22] Filed: Feb. 23, 1982

Related U.S. Application Data

[63] Continuation-in-part of Ser. No. 195,490, Oct. 9, 1980, abandoned.

[30] Foreign Application Priority Data

Oct. 17, 1979 [JP] Japan ................................ 54-134458

[51] Int. Cl.³ ............................................ G03B 27/52
[52] U.S. Cl. ....................................... 355/41; 355/53; 355/75; 356/401
[58] Field of Search ...................... 355/53, 67, 70, 41, 355/75; 356/399, 400, 401

[56] References Cited

U.S. PATENT DOCUMENTS

| | | | |
|---|---|---|---|
| 3,718,396 | 2/1973 | Hennings | 356/399 |
| 3,844,655 | 10/1974 | Johannsmeier | 355/75 |
| 4,070,117 | 1/1978 | Johannsmeier et al. | 356/400 |

Primary Examiner—Monroe H. Hayes
Attorney, Agent, or Firm—Fitzpatrick, Cella, Harper & Scinto

[57] ABSTRACT

An alignment apparatus effects positional adjustment between the image of a mask and a sensitive member by using a non-sensitive alignment mark image of the mask and an alignment mark formed on the sensitive member. The sensitive alignment mark image of the mask is formed on the alignment mark portion of the sensitive member in out-of focus condition. The alignment mark portion of the sensitive member is exposed by the sensitive mark image. Accordingly, the alignment mark of the sensitive member is protected.

4 Claims, 4 Drawing Figures

ALIGNMENT APPARATUS

This is a continuation-in-part of U.S. patent application Ser. No. 195,490 filed on Oct. 9, 1980 now abandoned.

BACKGROUND OF THE INVENTION

1. Field of the Invention

This invention relates to an alignment apparatus in which at least one of a mask and a sensitive member is moved relative to the other while an alignment mark on the mask illuminated by non-sensitizing light and an alignment mark on the sensitive member are observed, in order to bring the mask and the sensitive member into a predetermined positional relation. Thereafter the mask is illuminated by sensitizing light to print the pattern of the mask on the sensitive member.

2. Description of the Prior Art

Alignment apparatus of the general type described above may be roughly classified as (1) contact alignment apparatus in which printing is effected with a mask and a sensitive member (hereinafter) referred to as the wafer and for example coated with a photoresist) in intimate contact with each other, as (2) proximity alignment apparatus in which printing is effected with the mask and the wafer spaced apart from each other by 10–20 microns, or as (3) projection alignment apparatus in which an imaging optical system such as a lens, a mirror, an imaging system, etc. is disposed between the mask and the wafer and a mask image is formed on the wafer to thereby effect printing.

The alignment apparatus of the present invention falls in the projection alignment apparatus category and one feature thereof lies in that this apparatus prevents an alignment mark on the mask from being printed on the wafer. Briefly described, the the mark on the wafer is, therefore, protected or preserved because the alignment mark of the mask is prevented from being printed on the alignment mark of the wafer.

In contact alignment apparatus and proximity alignment apparatus, protection or preservation of the mark of the wafer has been done. That is, in U.S. Pat. No. 3,844,655, a sufficient printing light is imparted to the alignment mark portion of a wafer having a negative sensitivity characteristic through the alignment mark portion of a mask, thereby sensitizing the entire alignment mark portion of the wafer and preventing the alignment mark of the mask from being recorded.

This conventional system requires sufficient printing light to be imparted to the alignment mark of the wafer and this leads to disadvantage that the exposure time or the amount of exposure must be increased.

Particularly, where this conventional method is utilized in the projection alignment apparatus, if the imaging optical system is used intact, a mask image of good contrast will be formed on the alignment mark portion of the wafer and therefore, a long exposure time will be necessary to sensitize the entire mark area by applying light even to the portion shadowed by the mask. This procedure is not practical.

SUMMARY OF THE INVENTION

It is an object of the present invention to provide an alignment apparatus which eliminates the above-noted disadvantages. Such object is achieved by causing a defocused image of the alignment mark portion of a mask illuminated by sensitizing light to be formed on the alignment mark portion of a sensitive member, and sensitizing the entire alignment mark portion of the sensitive member with the defocused image.

The invention will become more fully apparent from the following detailed description thereof taken in conjunction with the accompanying drawings.

BRIEF DESCRIPTION OF THE DRAWINGS

FIG. 1, comprising

DESCRIPTION OF THE PREFERRED EMBODIMENTS

Figure 1A:
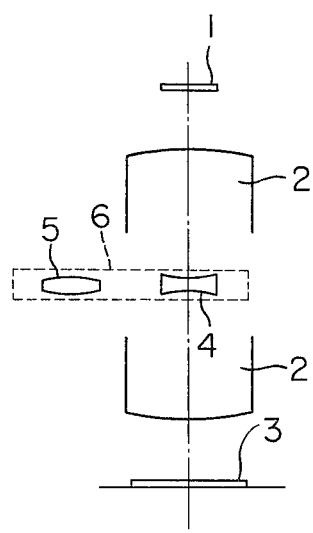
FIGS. 1A and 1B, shows the conditions of the imaging optical system of the alignment apparatus of the present invention during alignment and during printing.
Figure 1B:
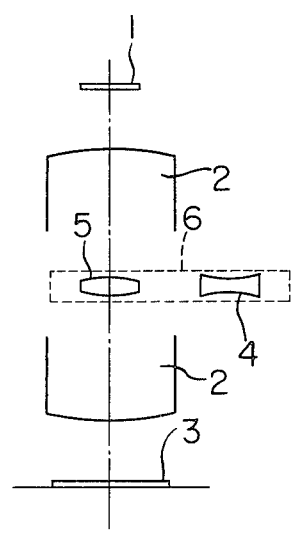
Figure 2:
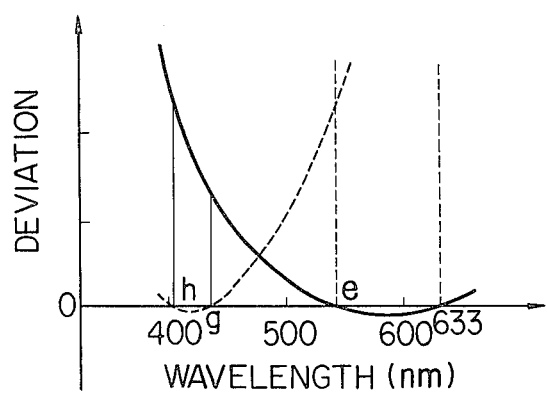
FIG. 2 is a graph illustrating the deviation of imaged position caused by the imaging system of FIG. 1 due to the difference between the printing light and the alignment light.
Figure 3:
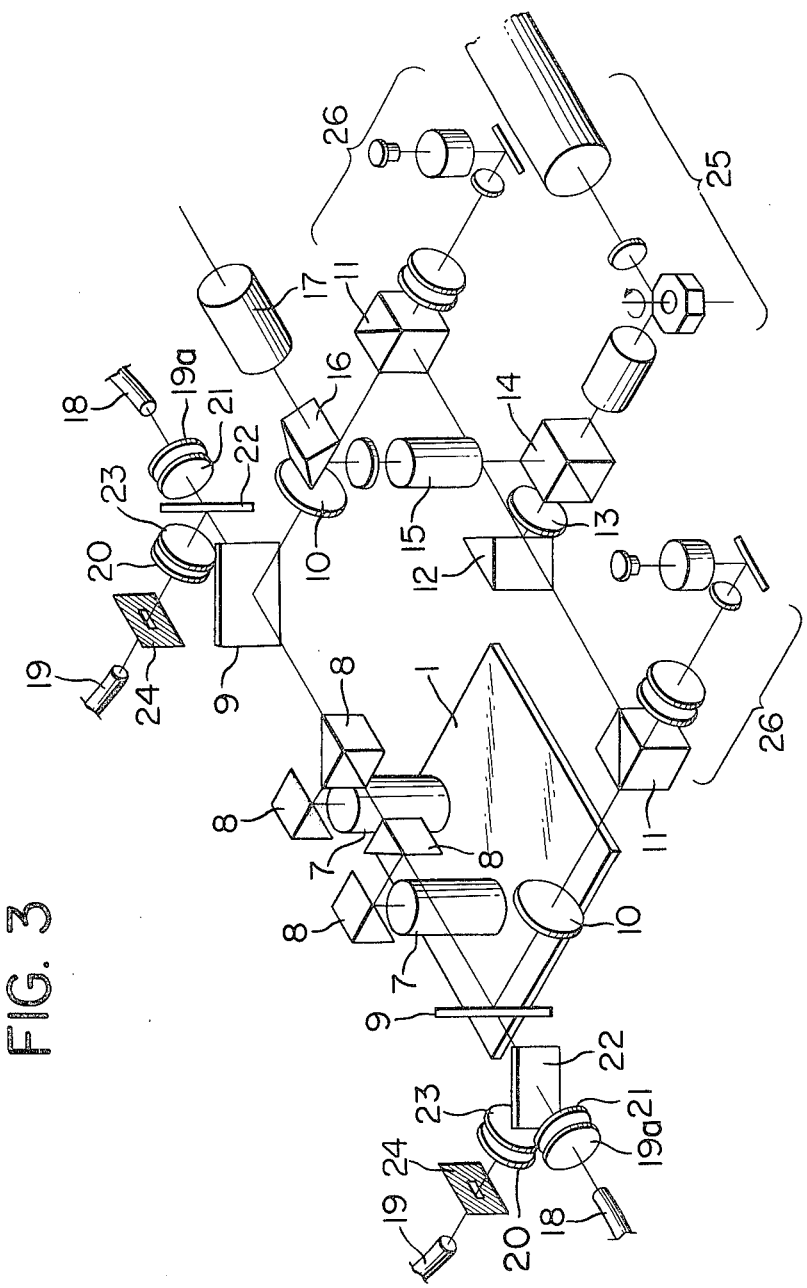
FIG. 3 shows the alignment scope system of the alignment apparatus of the present invention.

FIGS. 1 to 3 illustrate an embodiment of the alignment apparatus according to the present invention. This embodiment makes clever use of the wavelength characteristics of light. That is the alignment device uses light of different wavelength ranges during alignment and during printing. In the projection exposure method of the invention using a lens, either, or both of g-line and h-line sensitizing light is used for the printing, and e-line non-sensitizing light is used for the position adjustment. Accordingly, the lens used in the alignment device must be one which can form a mask image of good quality for these g-line, h-line, and e-line light.

Also, for example, where autoalignment using the laser wavelength is practiced, 633 nm is sometimes adopted as the wavelength for the position adjustment. In this case, the lens must be one which can also form an image of good quality for 633 nm. To shorten the printing time, the quantity of light must be used effectively. For this purpose, it is necessary to use not only g-line and h-line light but also light of spectrum width centering around g-line and h-line light, and it is desirable to make the variation in chromatic aberration as small as possible in the vicinity of these wavelengths. However, it is difficult to obtain an image of good quality for any of the light of these wavelengths with a single lens. That is, if the variation in chromatic aberration characteristic in the vicinity of sensitizing light is made small, the variation in chromatic aberration in the vicinity of non-sensitizing light will be large. For this reason, a method is known which uses, during alignment, a lens corrected in aberration for the light of e-line and 633 nm which are non-sensitizing light and uses, during printing, a lens corrected in aberration for g-line and h-line which are sensitizing light. Also, a method is known which comprises inserting a correcting lens during one or both of alignment and printing.

The apparatus of the present embodiment permits application of the lenses used in any of these methods. Accordingly, an example which uses a lens into which a correcting lens is inserted both during alignment and during printing will hereinafter be described representatively.

In the drawings, reference numeral 1 designates a mask, reference numeral 2 denotes a projection lens, and reference numeral 3 designates a wafer. Portion 4 and 5 of a lens assembly within the projection lens 2 are changed over between alignment and printing. With a slider mechanism 6, shown in schematically in phantom, the portions are shifted between printing and alignment operations. FIG. 1A shows the case in which the apparatus is configured to perform alignment, and FIG. 1B shows the case in which the apparatus is configured to perform printing. FIG. 2 shows an example of the condition in which the image of the mask 1 is projected on the wafer 3 during both alignment and printing. In FIG. 2, the solid line refers to the case of alignment, and the dotted line refers to case of printing. During the printing, the mask is in focus with respect to the wafer for g-line and h-line light, but is entirely out of focus in the vicinity of e-line and 633 nm light while, on the other hand, during the alignment, situation is reversed. The photoresist applied onto the wafer has sensitivity only to g-line and h-line light. Accordingly, observing the condition of the mask image projected on the wafer for the light of these two wavelengths, it will be seen that the mask image is formed on the wafer with a good contrast in the case of the optical system for printing, whereas the mask is entirely out of focus in the case of the optical system for alignment. The line width of the mark used for the autoalignment is usually about 2 $\mu$m–10 $\mu$m. Due to the thinness of the lines of the mark and their out-of-focus condition, the intensity distribution of the autoalignment mark of the mask formed on the wafer surface by g-line and h-line light in the case of the optical system configured for alignment becomes so dim that the presence of the mark cannot be recognized. The present embodiment protects the mark on the wafer by utilizing such dim image.

The embodiment will be more specifically described by reference to FIG. 3.

FIG. 3 shows an alignment optical system. In FIG. 3, reference numeral 1 designates a mask which corresponds to the mask of FIG. 1. Accordingly, the projection lens 2 and the wafer 3 are positioned below the mask. This condition shown is that during alignment and therefore, the projection lens 2 is in the condition of FIG. 1A. Reference numeral 7 designates microscope objective lenses opposed to the left and right alignment marks formed on portions of the mask. The light from these objective lenses 7 passes through respective prism mirrors 8, a half-mirrors 9, a relay lenses 10, a half-mirrors 11, a field splitting prism 12, a lens 13, a half-mirror 14, a lens 15 and a roof prism 16 to an eye-piece 17. Accordingly, the left and right alignment marks can be observed through the eye-piece 17.

Fibers 18 and 19 are connected to a high pressure mercury lamp and act as secondary light sources. Designated by 19a and 20 are collimater lenses. Reference numeral 21 designates two interference filters for passing therethrough e-line light which is non-sensitizing light, and reference numeral 22 denotes two dichroic mirrors for passing therethrough e-line and reflecting g-line and h-line light. The e-line light emergent from the fibers 18 passes through the dichroic mirrors 22 and is reflected by the prism mirrors 8 and enters into the microscope objective lenses 7 to illuminate the alignment mark portion of the mask 1. The light emergent from the other fibers 19 passes through the collimators 20 and color filters 23 which pass therethrough g-line and h-line light which are sensitizing light, and also enters into the objective lenses 7 to illuminate the alignment mark portion. Designated by 24 are two slit masks disposed at a position conjugate with the alignment mark portion of wafer 3. The slit masks 24 strictly restrict the illuminated area to the alignment mark portion. Reference numerals 25 and 26 designate automatic alignment mark scanning and detecting systems. These systems are not directly related to the present invention and therefore need not be described.

Operation will now be described. With the wafer 3 conveyed onto a wafer chuck below the mask 1 and the alignment optics of FIG. 3 positioned relative to the mask 1, the alignment between the mask 1 and the wafer 3 is effected. This alignment is automatically carried out through the microscope objective lens system. In this case, the alignment mark portion of the mask is illuminated not only by 633 nm which is non-sensitizing light but also by g-line and/or h-line light. The image of the alignment mark of the mask formed on the alignment mark portion of the wafer by g-line and h-line light becomes defocused, as previously described. Accordingly, there is the same effect as that obtained by effecting substantially uniform illumination. Therefore, the alignment mark portion of the wafer is substantially uniformly sensitized. After the termination of the alignment, the alignment optical system of FIG. 3 is removed. Then, the projection lens 2 assumes the condition of FIG. 1B and g-line and h-line light are projected onto the entire surface of the mask. By this irradiation, the circuit pattern and alignment mark image of the mask are formed as images of good quality on the wafer and thus, the circuit pattern is printed on the wafer. However, the alignment mark image of the mask is not printed on the wafer, because the alignment mark portion of the wafer has already been sensitized sufficiently by uniform light. Thus, the alignment mark of the wafer has been protected.

In summary, it is to be noted that, during alignment operation, the mask and the wafer are not in a conjugate relation with each other with respect to the printing light, as will be apparent from FIG. 2. Since the region on the wafer which is to be pre-exposed should be restricted, the slits 24 in FIG. 3 are disposed in a conjugate relation with the wafer. These slits, on the other hand, are not in a conjugate relation with the mask due to the chromatic abberation of the projection lens. As the result, the images of the slits 24 are focused on the wafer, whereas the image of the mask is defocused on the wafer.

With the present invention as described above, the protection of the alignment mark can be easily achieved without excessive exposure as in the conventional contact exposure process. Further, the alignment operation and the pre-exposure operation are effected at the same time, thus substantially eliminating a loss of the cycle time of the apparatus. Particularly, in a step and repeat system, the wafer at any shot other than the first shot reaches the predetermined objective position with an error of few micron millimeters, owing to the precision of the step. Therefore, the pre-exposure operation can be started just after completion of the step. Also in the first shot, the effect of the initial setting of the wafer is reduced, since the pre-exposure operation can be started when during the automatic alignment operation the deviation of the wafer becomes less than a predetermined value.

What I claim is:

1. An apparatus for aligning a mask having a circuit-pattern and an alignment mark thereon, and a sensitive member having an alignment mark thereon into a predetermined positional relation by using the two alignment marks, comprising:

a mask holder for supporting said mask;

a support member for supporting said sensitive member;

means for moving at least one of said mask holder and said support member relative to the other during an alignment operation to align a mask supported on said mask holder and a sensitive member supported on said support member;

an optical system in which during alignment operation said mask and said sensitive member are in a conjugate relation with each other with respect to non-sensitizing light and said mask and said sensitive member are in a defocused relation with each other with respect to sensitizing light;

means for detecting the relative positional relation between the alignment marks on said mask and said sensitive member using non-sensitizing light; and means for selectively exposing the alignment mark on said sensitive member to sensitizing light during the alignment operation.

2. An apparatus according to claim 1, wherein the image of at least the portion of said mask carrying the alignment mark thereon illuminated by non-sensitizing light is projected onto said sensitive member in an in-focus condition, while the image of at least the portion of said mask carrying the alignment mark thereon illuminated by sensitive light is projected on said sensitive member in an out-of-focus condition.

3. An apparatus according to claim 1, wherein said means for selectively exposing the alignment mark on said sensitive member includes a restricting member disposed at a position conjugate with said sensitive member with respect to the sensitizing light to restrict the region to be exposed.

4. An apparatus according to claim 1, wherein said means for selectively exposing the alignment mark on said sensitive member is operable simultaneously with alignment operation by said moving means.

* * * * *